United States Patent [19]

Miyake

[11] Patent Number: 4,791,634
[45] Date of Patent: Dec. 13, 1988

[54] CAPILLARY HEAT PIPE COOLED DIODE PUMPED SLAB LASER

[75] Inventor: Charles I. Miyake, Kirkland, Wash.

[73] Assignee: Spectra-Physics, Inc., San Jose, Calif.

[21] Appl. No.: 102,394

[22] Filed: Sep. 29, 1987

[51] Int. Cl.⁴ .............................................. H01S 3/04
[52] U.S. Cl. ..................................... 372/34; 372/35; 372/69
[58] Field of Search ....................... 372/34, 35, 66, 71, 372/72, 36, 69; 62/383, 95, 514 R, 110, 156

[56] References Cited

U.S. PATENT DOCUMENTS

| | | | |
|---|---|---|---|
| 4,454,602 | 6/1984 | Smith | 372/36 |
| 4,563,763 | 1/1986 | Kuhn | 372/35 |
| 4,601,040 | 7/1986 | Andrews et al. | 372/35 |

OTHER PUBLICATIONS

"The Potential of High-Average-Power Solid State Lasers", by Emmett, Krupke and Sooy, Lawrence Livermore National Laboratory Distribution Category UC-21,22, pp. 1-51.

"Advanced Two-Phase Capillary Cold Plate", by D. R. Chalmers et al., pp. 1-10.

*Primary Examiner*—Leon Scott, Jr.
*Attorney, Agent, or Firm*—Seed and Berry

[57] ABSTRACT

A diode pumped slab laser (DPSL) that is cooled by a capillary heat pipe cooling apparatus. The DPSL contains a diode array that is cooled by one or more capillary evaporators that are adjacent to the diode array of the DPSL or contained within a thermally conductive substrate surrounding the diode array of the DPSL. The capillary evaporators convert the liquid phase of a working fluid to a vapor phase which is circulated to a condenser. The condenser causes the phase of the working fluid to change to a liquid phase which is then drawn back to the capillary evaporators by the evaporation of the working fluid within the capillary evaporator. In one embodiment, the diode array is interleaved with heat sink strips that conduct the heat away from the diode array strips and toward a closely spaced capillary evaporator wick facing the diode array. The vapor is carried away from the diode array in the channels formed between consecutive heat sink strips.

21 Claims, 4 Drawing Sheets

CAPILLARY HEAT PIPE COOLED DIODE PUMPED SLAB LASER

DESCRIPTION

1. Technical Field

The present invention relates to diode slab lasers and more particularly, to diode slab lasers that are cooled by passive cooling apparatus.

2. Background Art

Diode pumped slab lasers (DPSLs) are capable of amplifying an input light beam at a given wavelength to an output beam of greater energy at that same wavelength. DPSLs contain a slab of a solid state material such as a neodymium-hosted material that is excited by a pump light source operating at a second wavelength, converting the pump energy into an amplified output beam at the first wavelength. It is desirable that the pump laser beam be distributed along a face of the slab material in order to reduce localized heating and corresponding thermal distortions. This permits the DPSL to provide more efficient amplification to the input beam. Therefore, it is desirable to generate the pump light by a semiconductor diode array that can be distributed along a face of the slab material that is parallel to the input and output beams, so that the pump laser beam can enter the slab material perpendicular to and along the path of the input beam through the slab material.

The beam quality of the output beam produced by the slab material is strongly affected by nonuniform heating, so it can be important to thermally isolate the slab material from the diode array. This thermal isolation is provided by placing a block of thermally resistive material that transmits the pump laser beam at the second wavelength. Sapphire is such a material.

Because the diode laser array can generate significant amounts of heat and because the diode array performance is strongly dependent on temperature, it is absolutely necessary to supply a cooling apparatus in order to prevent the diode array from being destroyed by overheating and to maintain desired diode array performance.

DPSLs may be used in space borne platforms. Current designs for space borne DPSLs require active cooling apparatus, involving mechanical pumps, coolant carrying tubing operated at pressure, and electrical supplies to drive the pumps. Since space-borne applications of DPSLs frequently require that the space craft platform be maintained as vibration free, simple, reliable, and light as possible, it is desirable to have a passive cooling apparatus for use with DPSLs.

DISCLOSURE OF THE INVENTION

It is an object of the present invention to provide a cooling apparatus for a DPSL having reduced cooling system energy requirements.

It is another object of the present invention to provide a cooling apparatus for a DPSL that is vibration free.

It is a further object of the present invention to provide a cooling apparatus for a DPSL that is simple and highly reliable.

It is a still further object of the present invention to provide a cooling apparatus for a DPSL that is very light.

These and other objects of the present invention are provided by a cooling apparatus comprising one or more axial capillary evaporators in proximity to the diode array. Each evaporator has an input end and an output end and is operable to vaporize the liquid phase of the working fluid to the vapor phase. The cooling apparatus further comprises a liquid conduit and a vapor conduit. The liquid and vapor conduits are respectively attached to the input and output ends of each evaporator for supplying a liquid phase of the working fluid to each of the evaporators and producing a vapor phase of the working fluid. In one aspect of the invention, the capillary evaporators are built into a substrate material that supports the diode array of the diode pumped slab laser.

The present invention also includes a diode pumped slab laser operable to produce an output laser beam at a first wavelength along an axis. The diode pumped slab laser comprises a diode array consisting of an axially layered structure of thin diode strips for producing a pump light beam transverse to the axis, the pump light beam including light having a second wavelength. The laser further comprises a source of an axial input laser light beam including light having the first wavelength and an axial slab of solid-state material. The axial slab is transversely opposite to a first side of the diode array and adapted to receive the pump light beam and the axial input laser light beam. The pumped solid-state material amplifies the axial input laser light beam to produce the axial output laser beam. In addition, the laser comprises an axial capillary evaporator having an axial surface in close transverse proximity to a side of the diode array different from the first side, the evaporator having an input end and an output end and being operable to vaporize a liquid phase of a working fluid to a vapor phase of the working fluid. In addition, the laser comprises a liquid conduit for conducting the liquid phase of the working fluid to the input end of the evaporator and a vapor channel for conducting the vapor phase of the working fluid away from the output end of the evaporator.

In one embodiment, the liquid conduit of the diode pumped slab laser further comprises a liquid channel transversely adjacent a first side of the diode array and transversely adjacent the first side of the axially extending slab of solid state material. The liquid channel is adopted to carry the liquid phase of the working fluid to the input end of the evaporator and to transmit the pump light beam from the first side of the diode array to the first side of the axially extending slab of solid state material, and further resisting the conduction of thermal energy from the diode array to the axially extending slab of solid state material.

In another embodiment, the diode pumped slab laser further comprises a thermally resistive axial block of material that transmits light having the second wavelength. The block is transversely adjacent a first side of the diode array and adapted to transmit the pump light transversely from the first side to an opposite side. In this embodiment, the axial slab of solid state material is adapted to receive the pump light beam and the axial input laser light beam while remaining substantially thermally isolated from the diode array.

BEST MODES FOR CARRYING OUT THE INVENTION

Figure 1:
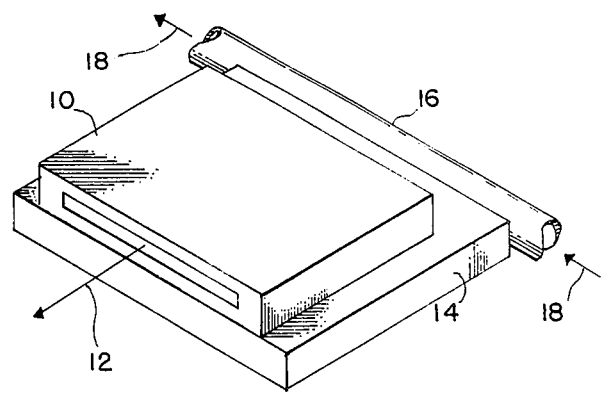
FIG. 1 is an isometric, schematic view of a prior art diode laser cooling apparatus.

The schematic isometric view of FIG. 1 shows a prior art method for cooling a diode portion 10 of a diode pumped slab laser. The diode 10 which typically consists of a sandwich of layers of semiconductor material (for example, GaAsAl) having different conductivity types (that is, n conductivity and p conductivity). The diode 10 can be caused to produce a fan beam of light at a predetermined wavelength in the direction indicated by the arrow 12 by being connected to a direct current (DC) voltage source in a manner well known to those skilled in the art. The efficiency of such a diode is approximately 25%. Therefore, about 75% of the electrical energy supplied to the diode 10 is rejected as waste heat.

To accommodate this heat rejection, the diode 10 can be attached or placed adjacent to a heat sink 14 which is made from a highly thermally conductive material such as copper. It is known in the prior art to cool the diode 10 as shown in the embodiment of FIG. 1, in which the heat sink 14 is attached to a coolant conducting pipe 16. The pipe 16 is also made from a highly thermally conductive material so that the heat conducted to it by the heat sink 14 is transferred to a coolant that is passing through the pipe 16, as indicated by the arrows 18.

Figure 2A:
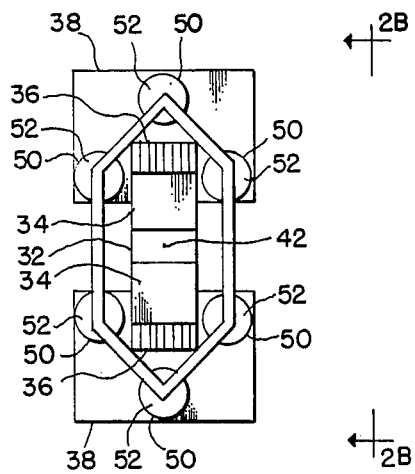
FIG. 2A is an elevational end view of a first embodiment of a diode pumped slab laser according to the present invention.
Figure 2B:
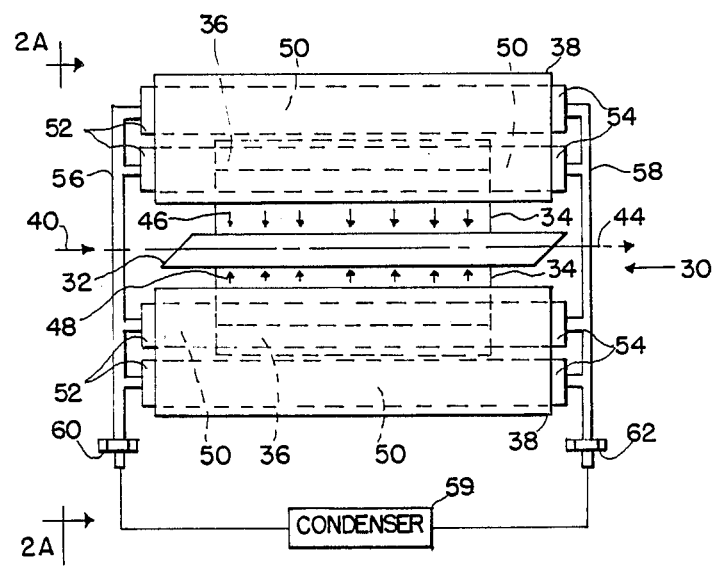
FIG. 2B is an elevational side view of the first embodiment of the diode pumped slab laser of the present invention, also shown in FIG. 2A.

FIGS. 2A and 2B are end and side views of a first embodiment of a DPSL 30 of the present invention. The DPSL 30 consists of an elongated solid state material slab 32, such as a crystal of neodymium-hosted materials, including Nd:YAG (ytrrium aluminum garnet). The DPSL 30 also consists of a pair of thermally resistive axial blocks 34, made from a material such as sapphire, positioned on opposite sides of the semiconductor material slab 32. A diode array 36 is located adjacent to each of the axial blocks 34 on a side of the block outward of the semiconductor material slab 32, and is otherwise surrounded by a thermally conductive substrate 38. Copper is a particularly convenient material to use for the conductive substrate 38.

The DPSL 30 receives an input beam of laser light having a first wavelength. The DPSL can receive the input bean in the direction indicated by the arrow 40 in FIG. 2B along a longitudinal axis 42. Also as a result, an amplified output beam of laser light at the first wavelength is produced along the axis 42 in the direction indicated by arrow 44 in FIG. 2B. Alternatively, the input beam may be introduced at an angle to the direction 40, which increases the path length through the slab 32 and produces an output beam at the same angle to the direction 44. The solid state material slab 32 is excited, in the two directions indicated by the arrows 46 and 48 in FIG. 2B, by a pump light beam at a second wavelength which is produced by the diode arrays 36.

The heat that is produced by the diode arrays 36 is conducted to the conductive substrates 38, which each contain one or more axial capillary evaporators 50 with two evaporators being shown in FIG. 2B for each conductive substrate. Each capillary evaporator 50 has an input end 52 and an output end 54.

The cooling apparatus of the present invention comprises, in addition to the axial capillary evaporators 50, a liquid header 56 and a vapor header 58 that are respectively attached to the input and output ends 52 and 54 of the capillary evaporators 50. The liquid and vapor headers 56 and 58, respectively, can be connected to a conventional condenser 59 through fittings 60 and 62. The condenser 59 condenses the vapor phase of a working fluid (for example, ammonia) received from the vapor header 58 to the liquid phase to supply the liquid working fluid to the liquid header 56. The working fluid is circulated within the capillary evaporators 50, the liquid and vapor headers 56 and 58, and the condenser 59 in the process of removing heat produced by the diode arrays 36. The working fluid has liquid and vapor phases and is supplied to evaporators 50 in the liquid phase through their input ends 52. The working fluid is vaporized in the capillary evaporator 50 from its liquid phase to its vapor phase by rejected heat produced by the diode arrays 36. The capillary evaporators 50 provide their own pumping action due to the wicking action of the porous wick material, and the vapor produced is directed through their output ends 54 to the vapor header 58 and then to the condenser 59 where the working fluid is returned to its liquid phase. The working fluid in the liquid phase then passes through the liquid header 56 and returns to the input ends 52 of the capillary evaporators 50. This cooling apparatus is passive, simple, lightweight, and free of vibration.

Figure 3:
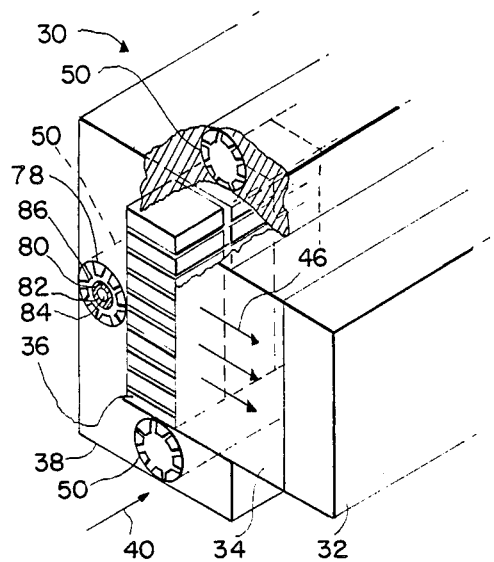
FIG. 3 is an enlarged, cutaway, isometric view of the embodiment of the diode pumped slab laser shown in FIGS. 2A and 2B, turned ninety degrees from the view in FIG. 2A.

Referring now to FIG. 3, an enlarged, cutaway, isometric view of a portion of the DPSL 30 (shown turned ninety degrees from the view of FIG. 2A) that contains the capillary evaporators 50 integrated with the thermally conductive substrate 38. Each capillary evaporator 50 includes an axially grooved tube 78 extending through the length of the conductive substrate 38 and longitudinally extending vapor channels 80 defined by heat-conducting, longitudinally extending and radially inwardly projecting axial fins 86 positioned to define the vapor channels 80. A porous hollow wick 82 is positioned within tube 78 and defines a central liquid conduit 84 through the center of the wick 82. Liquid enters the liquid conduit 84 through the liquid header 56 (see FIGS. 2A and 2B) which is attached to the input end 52 of the capillary evaporator 50. The liquid phase of the working fluid is absorbed from the liquid conduit 84 by the porous wick 82 where it moves radially by capillary action toward the vapor channels 80. The axial fins 86 carry the heat from the substrate 36 to the outer surface of the porous wick 82. The heat from the axial fins 86 causes the working fluid in the porous wick 82 to locally vaporize and migrate to the vapor channels 80 which conduct the vapor to the output end 54 of the capillary evaporator 50. The vapor phase of the working fluid is then carried away from the output end 54 of the capillary evaporator 50 through the vapor header 58.

In one embodiment, the diode array 36 can produce light having a wavelength of 810 nanometers through the thermally resistive axial block 34 in the direction indicated by the arrows 46 and 48 to the solid state material slab 32. The solid state material slab 32 can be made from Nd:YAG, which has a particularly high absorbence of light at an 810 nanometer wavelength. The diode array 36 can be supplied with pulsed DC power having an amplitude of 200 volts and a pulse length of 200 nanoseconds. In one embodiment, the diode array 36 produces an approximate average of 8 watts per square centimeter. Since the diode array is approximately 25% efficient, it will transfer approximately 2 watts per square centimeter of light into the block 34 and approximately 6 watts per square centimeter of heat into the conductive substrate 38. The semiconductor material slab 32 converts the light energy it receives from the diode array 36 to light at the output wavelength with an efficiency of approximately 28%. The overall conversion efficiency of the DPSL is, accordingly, $0.28 \times 0.25 = 0.07$, or 7%.

The input beam received by the semiconductor material slab 32 in the direction indicated by the arrow 40 can have a wavelength of 1060 nanometers. Therefore, the amplified output beam produced in the direction of the arrow 44 (see FIG. 2B) is a series of 200 nanosecond pulses of 1060 nanometer light whose energy gain is 7% of the electrical energy input to the diode array 36.

Figure 4:
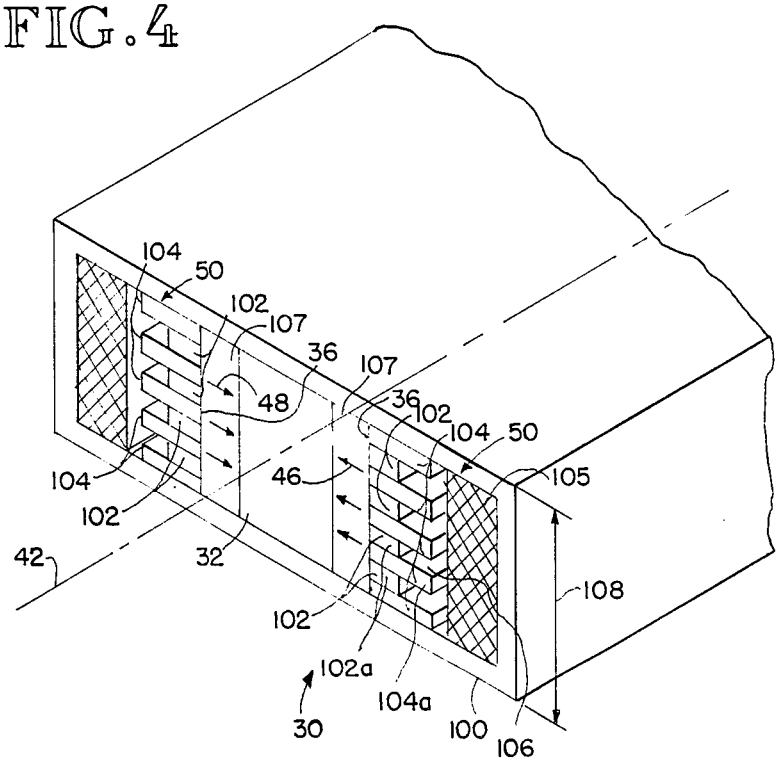
FIG. 4 is an isometric view of a second embodiment of the diode pumped slab laser of the present invention.

FIG. 4 is an isometric view of an end portion of an alternative embodiment of the DPSL 30 of the present coolant invention. The solid state material slab 32, a liquid channel 107, the diode array 36, and the axial capillary evaporator 50 are contained within an elongated enclosure 100 made, for example, from aluminum. The liquid channel 107 can carry the coolant in either liquid or vapor phase.

The diode array 36 is a layered structure of longitudinally extending thin diode strips 102. It is particularly advantageous to interleave the diode strips 102 with heat sink strips 104 made, for example, from copper. The layered structure of thin strips is oriented parallel to the axis 42. The pump light (for example, at 810 nanometers) passes through the liquid channel 107 into the semiconductor material slab 32 at about ninety degrees to the axis. The diode array 36 is positioned immediately adjacent the liquid channel 107.

The heat sink strips 104 are wider than the diode strips 102, so that edge portions 104a of the heat sink strips 104 project beyond the corresponding edge portions 102a of the diode strips to a position closer to a rectangularly shaped, elongated porous wick 105 (for example, made from stainless steel wool) than do the diode strips 102. Wick 105 is an open-ended, longitudinally extending, rectangular wick enclosed in a conduit defined by the walls of the enclosure 100 on three sides and by the heat sink strips 104 on the fourth side. The spaces between the edge portions 104a of the heat sink strips 104 define a plurality of longitudinally extending vapor channels 106. The porous wick 105, which is in close proximity to the edge portions 104a of the heat sink strips 104, carries the liquid phase of the working fluid toward the heated edge portions 104a of the heat sink strips 104 through capillary action. The surface of the wick 105 delivers liquid to the heat sink 104. The liquid receives the heat conducted from the diode strips 102 onto the heat sink strips 104. The heated heat sink strips 104 therefore cause the liquid working fluid at the surface of the porous wick 105 to be vaporized into the vapor channels 106 defined between the adjacent heat sink strips 104. The vapor phase is carried away in the vapor channels 106 to the output end 54 of the evaporator 50, from which it is conducted to a conventional condenser (not shown) to be recondensed into the liquid phase.

The diode strips 102 and the heat sink strips 104 are each approximately 0.5 millimeters thick. The diode strips 102 are approximately 5 millimeters wide. If heat sink strips are approximately 10 millimeters wide. If the vertical dimension of the DPSL 30 shown in FIG. 4 is 9 centimeters (as shown by arrow 108), the diode array can consist of approximately ninety diode strips 102 alternating with ninety heat sink strips 104. The length of the DPSL 30 in the direction of the axis 42 can be chosen to produce the output power desired. If the DPSL 30 is approximately 12 centimeters long, and the pulse frequency is ten pulses per second, the energy per pulse is approximately one to two Joules per pulse.

Figure 5:
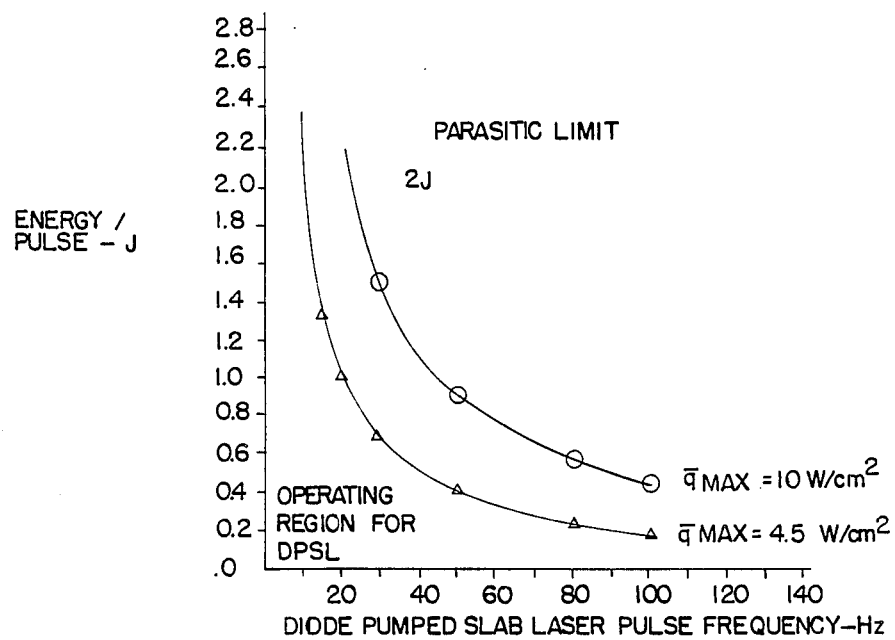
FIG. 5 is a graph showing the operating region for a diode pumped slab laser as a function of pulse frequency and energy per pulse.

Referring to the graph of FIG. 5, which shows two curves parameterized by the heat flux capbility of the cooling system, $q_{max}$, and assuming that the solid state material slab 32 is a 12 centimeter long by 2 centimeter wide Nd:YAG slab, the operating region for a DPSL is shown below each of the curves given.

Those skilled in the art of diode slab laser design will appreciate that various modifications of the foregoing embodiments can be made without departing from the spirit and scope of the invention. Accordingly, the spirit and scope of the invention are to be limited only by the following claims.

I claim:

1. A cooling apparatus for cooling a diode pumped slab laser with a working fluid having liquid and vapor phases, comprising:
   one or more axial capillary evaporators in proximity with the diode pumped slab laser, the evaporators each having an input end and an output end;
   liquid conduit means attached to the input end of each of the evaporators for supplying a liquid phase of the working fluid to each of the evaporators; and
   vapor conduit means attached to the output end of each of the evaporators for receiving a vapor phase of the working fluid from each of the evaporators.

2. The cooling apparatus of claim 1, further comprising:
   condenser means connected between the vapor conduit means and the liquid conduit means, for receiving the vapor phase of the working fluid from the vapor conduit means, condensing the vapor phase of the working fluid to the liquid phase, and supplying the condensed liquid phase of the working fluid to the liquid conduit means.

3. The cooling apparatus of claim 1, further comprising a heat sink at least partially surrounding the diode pumped slab laser in close proximity therewith, the evaporators being contained within the heat sink.

4. The cooling apparatus of claim 1 wherein each capillary evaporator comprises a capillary wick with a planar face and a vapor channel formed between the planar face and the diode array, the vapor channel conducting the vapor phase of the working fluid to the output end of the evaporator.

5. A cooling apparatus for a diode pumped slab laser, the cooling apparatus using a working fluid having liquid and vapor phases, comprising:
   one or more axial capillary evaporators formed in a thermally conductive substrate material of the diode pumped slab laser and having an input end and output end;

liquid header means for conducting the liquid phase of the working fluid to the input end of the evaporator;

vapor header means for carrying out the vapor phase of the working fluid from the output end of the evaporator; and condenser means connected between the vapor conduit means and the liquid conduit means for condensing the vapor phase of the working fluid to the liquid phase of the working fluid.

6. The cooling apparatus of claim 5 wherein the thermally conductive substrate is made from copper.

7. A diode pumped slab laser for producing an output laser beam at a first wavelength along an axis and being cooled using a working fluid having liquid and vapor phases, comprising:

diode array means for producing a pump light beam transverse to the axis, the diode array means consisting of a layered structure of axially extending thin diode strips with first and second edge sides, the pump light beam passing through the first edge sides and including light having a second wavelength;

a source of an axial input laser light beam including light having the first wavelength;

axially extending slab means for receiving the pump light beam and the axial input laser light beam and producing the axial output laser beam in response thereto, the slab means being made from solid-state material having a first side positioned opposite to the first edge sides of the diode strips;

an axially extending capillary evaporator having an axially extending surface positioned in close proximity to the second edge sides of the diode strips, the evaporator further having an input end and an output end;

liquid conduit means for conducting the liquid phase of the working fluid to the input end of the evaporator; and vapor conduit means for conducting the vapor phase of the working fluid from the output end of the evaporator.

8. The diode pumped slab laser of claim 7, further comprising:

condenser means connected between the vapor conduit means and the liquid conduit means for condensing the vapor phase of the working fluid to the liquid phase of the working fluid.

9. The diode pumped slab laser of claim 7 wherein the capillary evaporator comprises a capillary wick with a planar face and a vapor channel formed between the planar face and the diode array, the vapor channel conducting the vapor phase of the workingfluid to the output end of the evaporator.

10. The diode pumped slab laser of claim 7 wherein the diode array has alternating layers of axially extending diode strips and axially extending heat sink strps, the heat sink strips having third and fourth edge sides, the second edge sides the fourth edge sides being positioned beyond the fourth edge sides to form vapor channels therebetween to conduct the vapor phase of the working fluid to the outlet end of the evaporator.

11. The diode pumped slab laser of claim 10 wherein the third edge sides of the heat sink strips are adjacent to the first side of the slab.

12. The diode pumped slab laser of claim 10 wherein the capillary evaporator comprises a capillary wick with a planar face and a vapor channel formed between the planar face and the diode array, the vapor channel conducting the vapor phase of the working fluid to the output end of the evaporator.

13. The diode pumped slab laser of claim 7, the liquid conduit comprising liquid channel means for carrying the liquid phase of the working fluid to the input end of the evaporator and transmitting the pump light beam from the first side of the diode array to the first side of the axially extending slab of solid state material, and further for substantially resisting the conduction of thermal energy from the diode array to the axially extending slab of solid state material, the liquid channel means being transversely adjacent a first side of the diode array and transversely adjacent the first side of the axially extending slab of solid state material.

14. The diode pumped slab laser of claim 7 wherein the diode array has alternating layers of axially extending diode strips and axially extending heat sink strips, the heat sink strips having third and fourth edge sides, the fourth edge sides being positioned beyond the second edge sides to form vapor channels therebetween to conduct the vapor phase of the working fluid to the outlet end of the evaporator.

15. A diode pumped slab laser for producing an output laser beam at a first wavelength along an axis and being cooled using a working fluid having liquid and vapor phases, comprising:

diode array means for producing a pump light beam transverse to the axis, the diode array means consisting of a layered structure of axially extending thin diode strips with first and second edge sides, the pump light beam passing through the first edge sides and including light having a second wavelength;

a source of an axial input laser light beam including light having the first wavelength;

transmission means comprising a thermally resistive axially extending block of material that transmits light having the second wavelength, the transmission means being transversely adjacent to a first side of the diode array and being adapted for transmitting the pump light beam transversely therethrough to an opposite side;

axially extending slab means for receiving the pump light beam and the axial input laser light beam while remaining substantially thermally isolated from the diode array, and for amplifying the axial input laser light beam and producing the axial output laser beam in response thereto, the slab means being made from solid-state material having a first side positioned opposite to the first edge sides of the diode strips;

an axially extending capillary evaporator having an axially extending surface positioned in close proximity to the second edge sides of the diode strips, the evaporator further having an input end and an output end;

liquid conduit means for conducting the liquid phase of the working fluid to the input end of the evaporator; and vapor conduit means for conducting the vapor phase of the working fluid from the output end of the evaporator.

16. The diode pumped slab laser of claim 15, further comprising:

condenser means connected between the vapor conduit means and the liquid conduit means for condensing the vapor phase of the working fluid to the liquid phase of the working fluid.

17. The cooling apparatus of claim 15 wherein the thermally resistive axially extending block is made from sapphire.

18. The cooling apparatus of claim 15 wherein the axially extending slab is made from Nd:YAG.

19. A diode pumped slab laser for producing an output laser beam at a first wavelength along an axis and being cooled using a working fluid having liquid and vapor phases, comprising:

diode array means for producing a pump light beam transverse to the axis, the diode array means consisting of a layered structure of axially extending thin diode strips with first and second edge sides, and the pump light beam including light having a second wavelength;

a source of an axial input laser light beam including light having the first wavelength;

axially extending slab means for receiving the pump light beam and the axial input laser light beam while remaining substantially thermally isolated from the diode array, and for amplifying the axial input laser light beam and producing the axial output laser beam in response thereto, the slab means being made from solid-state material having a first side positioned opposite to the first edge sides of the diode strips;

an axially extending capillary evaporator having an axially extending surface positioned in close proximity to second edge sides of the diode strips, the evaporator further having an input end and an output end;

liquid conduit means for conducting the liquid phase of the working fluid to the input end of the evaporator, the liquid conduit comprising liquid channel means transversely adjacent a first side of the diode array and transversely adjacent the first side of the axially extending slab of solid state material, the liquid channel means being for carrying the liquid phase of the working fluid to the input end of the evaporator, transmitting the pump light beam from the first side of the diode array to the first side of the axially extending slab of solid state material, and further for substantially resisting the conduction of thermal energy from the diode array to the axially extending slab of solid state material, and vapor conduit means for conducting the vapor phase of the working fluid from the output end of the evaporator.

20. The cooling apparatus of claim 19 wherein the thermally resistive axially extending block is made from sapphire.

21. The cooling apparatus of claim 19 wherein the axially extending slab is made from Nd:YAG.

* * * * *

UNITED STATES PATENT AND TRADEMARK OFFICE
CERTIFICATE OF CORRECTION

PATENT NO. : 4,791,634

DATED : December 13, 1988

INVENTOR(S) : Charles I. Miyake

It is certified that error appears in the above-identified patent and that said Letters Patent is hereby corrected as shown below:

In claim 7, column 7, lines 27-28, following "and" and before "producing", insert: --for amplifying the axial input laser light beam and--.

In claim 9, line 53, delete "workingfluid" and substitute therefor --working fluid--.

In claim 10, line 57, delete "strps" and substitute therefor --strips--.

In claim 19, column 10, line 3, following "to" and before "second", include --the--.

Signed and Sealed this

Thirteenth Day of June, 1989

Attest:

DONALD J. QUIGG

Attesting Officer

Commissioner of Patents and Trademarks